US009786754B1

(12) United States Patent
Lee et al.

(10) Patent No.: US 9,786,754 B1
(45) Date of Patent: Oct. 10, 2017

(54) METHOD FOR FORMING SEMICONDUCTOR DEVICE STRUCTURE

(71) Applicant: Vanguard International Semiconductor Corporation, Hsinchu (TW)

(72) Inventors: Chung-Yeh Lee, Sinpu Township (TW); Chih-Ping Lin, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/425,673

(22) Filed: Feb. 6, 2017

(51) Int. Cl.
*H01L 21/311* (2006.01)
*H01L 29/423* (2006.01)
(Continued)

(52) U.S. Cl.
CPC .... *H01L 29/4236* (2013.01); *H01L 21/02274* (2013.01); *H01L 21/304* (2013.01); *H01L 21/3043* (2013.01); *H01L 21/3065* (2013.01); *H01L 21/3081* (2013.01); *H01L 21/3086* (2013.01); *H01L 21/30604* (2013.01);
(Continued)

(58) Field of Classification Search
CPC ......... H01L 29/4236; H01L 21/823437; H01L 21/823487; H01L 21/32133; H01L 29/1095; H01L 29/0847; H01L 21/311; H01L 21/31; H01L 21/3212; H01L 21/302; H01L 21/304; H01L 21/30604; H01L 21/3065
See application file for complete search history.

(56) References Cited

U.S. PATENT DOCUMENTS 9,349,833 B1 * 5/2016 Hung ............... H01L 29/4983
9,378,963 B2 * 6/2016 Yeh ................. H01L 21/31144
(Continued)

FOREIGN PATENT DOCUMENTS

CN     104769723 A    7/2015
TW     200739695 A    10/2007
(Continued)

OTHER PUBLICATIONS

Taiwanese Notice of Allowance and Search Report, dated Feb. 22, 2017, for Taiwanese Application No. 105123697.

Primary Examiner — Savitr Mulpuri
(74) Attorney, Agent, or Firm — Birch, Stewart, Kolasch & Birch, LLP

(57) ABSTRACT

A method for forming a semiconductor device structure is provided. The method includes: forming a plurality of trenches in the substrate; forming a gate dielectric layer lining the trenches; filling the trenches with a gate material; etching back the gate material to expose an upper portion of the trenches; forming a first dielectric layer to refill the upper portion of the trenches, and to cover a substrate surface between the trenches; performing a first chemical mechanical planarization process to partially remove the first dielectric layer until the substrate surface between the trenches is exposed. The method also includes using the first dielectric layer in the upper portion of the trenches as an etching mask, etching the substrate through the exposed substrate surface to form a self-aligned contact opening between the trenches.

12 Claims, 17 Drawing Sheets

(51) Int. Cl.
    *H01L 21/8234*   (2006.01)
    *H01L 21/3213*   (2006.01)
    *H01L 21/3105*   (2006.01)
    *H01L 21/308*    (2006.01)
    *H01L 21/02*     (2006.01)
    *H01L 29/10*     (2006.01)
    *H01L 29/08*     (2006.01)
    *H01L 21/321*    (2006.01)
    *H01L 21/306*    (2006.01)
    *H01L 21/304*    (2006.01)
    *H01L 21/3065*   (2006.01)

(52) U.S. Cl.
    CPC ...... *H01L 21/311* (2013.01); *H01L 21/31055* (2013.01); *H01L 21/3212* (2013.01); *H01L 21/32133* (2013.01); *H01L 21/823437* (2013.01); *H01L 21/823487* (2013.01); *H01L 29/0847* (2013.01); *H01L 29/1095* (2013.01)

(56) References Cited

U.S. PATENT DOCUMENTS

| | | | |
|---|---|---|---|
| 9,425,109 B2* | 8/2016 | Cheng | H01L 22/26 |
| 9,496,361 B1* | 11/2016 | Tung | H01L 29/4958 |
| 2010/0308400 A1 | 12/2010 | Darwish et al. | |
| 2012/0286375 A1* | 11/2012 | Cai | H01L 21/823412 |
| | | | 257/412 |
| 2014/0061925 A1* | 3/2014 | Kim | H01L 29/66477 |
| | | | 257/758 |
| 2016/0268392 A1* | 9/2016 | Zhu | H01L 21/76224 |
| 2017/0077256 A1* | 3/2017 | Adusumilli | H01L 29/4966 |
| 2017/0162669 A1* | 6/2017 | Chen | H01L 29/66545 |
| 2017/0194443 A1* | 7/2017 | Chen | H01L 29/4236 |

FOREIGN PATENT DOCUMENTS

| | | |
|---|---|---|
| TW | 200845229 A | 11/2008 |
| TW | 201507153 A | 2/2015 |

\* cited by examiner

METHOD FOR FORMING SEMICONDUCTOR DEVICE STRUCTURE

TECHNICAL FIELD

The present disclosure relates to a method for forming a semiconductor device structure, and in particular it relates to a method for forming a trench gate metal-oxide-semiconductor field effect transistor (trench gate MOSFET).

BACKGROUND

The integration density of different electronic components is continuously improved in the semiconductor industry. Continuously decreasing the minimum size of the components allows more and more components to be integrated in a given area. For example, the trench gate metal-oxide-semiconductor field effect transistor, which is widely applied in power switch components, is designed to have a vertical structure to increase the functional density. In a trench gate metal-oxide-semiconductor field effect transistor, the back side of the chip serves as a drain, and the sources and gates of various transistors are formed at the front side of the chip.

However, as the functional density of semiconductor devices continuously increases, the complexity of processing and manufacturing semiconductor devices also increase. For example, due to the restrictions of the alignment ability of traditional lithography machines, the scaling-down process of the feature size of the trench gate metal-oxide-semiconductor field effect transistors cannot be carried out. Therefore, the on resistance of semiconductor devices cannot be decreased effectively.

BRIEF SUMMARY OF THE DISCLOSURE

An embodiment of the present disclosure provides a method for forming a semiconductor device structure, comprising: forming a plurality of trenches in a substrate; forming a gate dielectric layer lining the plurality of trenches; filling the plurality of trenches with a gate material; etching back the gate material to expose an upper portion of the plurality of trenches; forming a first dielectric layer to refill the upper portion of the plurality of trenches and to cover a substrate surface between the plurality of trenches; performing a first chemical mechanical planarization process to partially remove the first dielectric layer until the substrate surface between the plurality of trenches is exposed; and using the first dielectric layer in the upper portion of the plurality of trenches as an etching mask, etching the substrate through the exposed substrate surface to form a self-aligned contact opening between the plurality of trenches.

An embodiment of the present disclosure provides a method for forming a semiconductor device structure, comprising: providing a substrate, wherein a pad layer is formed on the substrate; forming a plurality of trenches in the substrate; isotropically etching a top corner of the plurality of trenches to expand the upper portion of the plurality of trenches; forming a gate dielectric layer lining the plurality of trenches; filling the plurality of trenches with a gate material; etching back the gate material to expose the expanded upper portion of the plurality of trenches; forming a dielectric layer to refill the expanded upper portion of the plurality of trenches and to cover a substrate surface between the plurality of trenches; performing a chemical mechanical planarization process to partially remove the dielectric layer until the substrate surface between the plurality of trenches is exposed; and using the dielectric layer in the expanded upper portion of the plurality of trenches as an etching mask, etching the substrate through the exposed substrate surface to form a self-aligned contact opening between the plurality of trenches.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
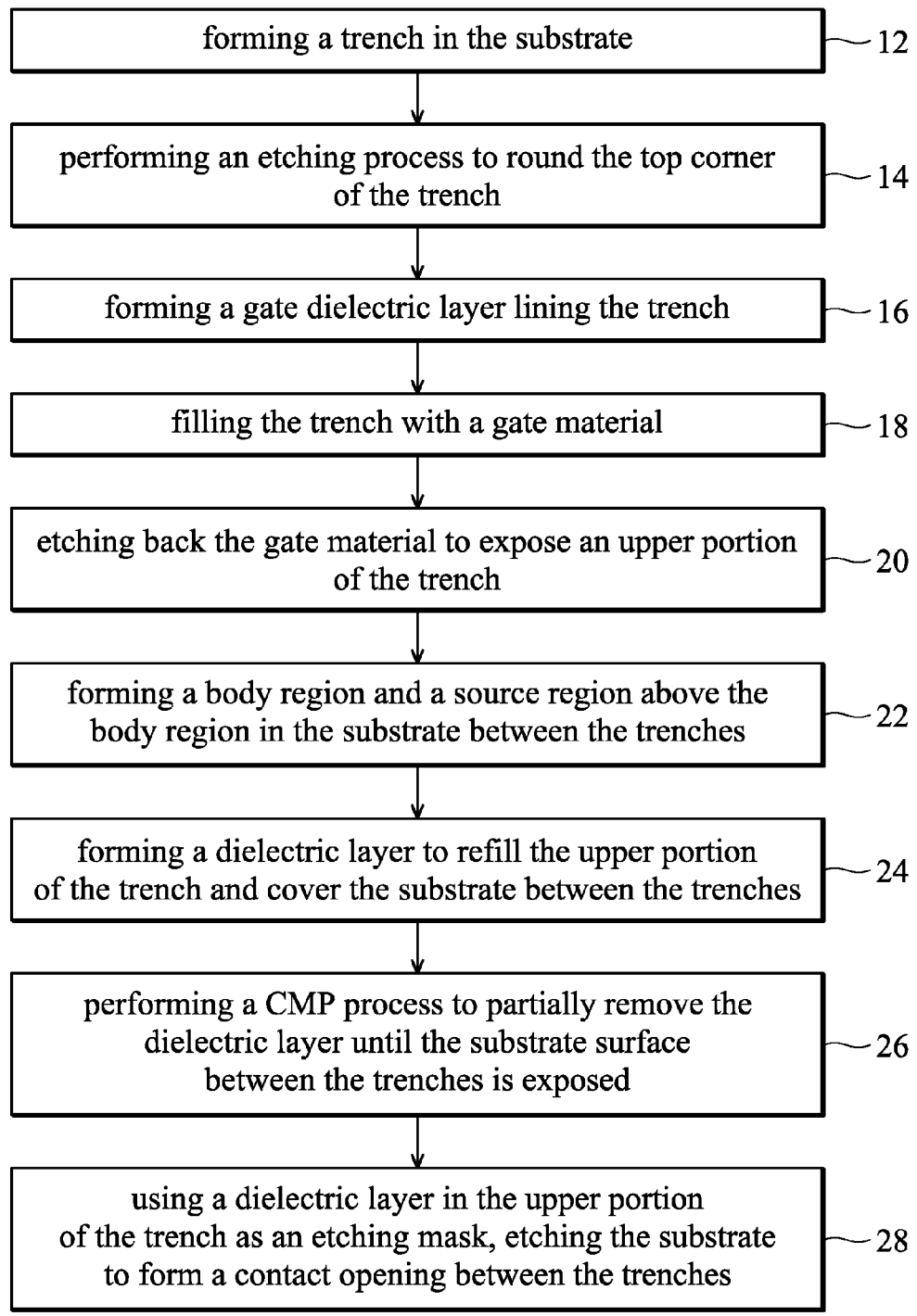
FIG. 1 is a flowchart of an exemplary method for forming a semiconductor device structure in accordance with some embodiments.

The present disclosure can be more fully understood by reading the subsequent detailed description and examples with references made to the accompanying drawings. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

It should be appreciated that specific examples of components and arrangements are described below to simplify the present invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present invention may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The method for forming a semiconductor device structure provided in the present disclosure uses chemical mechanical planarization processes having high selectivity in combination with etching processes having high selectivity to form a self-aligned contact structure, which may be applied in a trench gate metal-oxide-semiconductor field effect transistor (trench gate MOSFET). The method may contribute to the scaling down of the critical size of the semiconductor device structure, and may also effectively decrease the on resistance of the semiconductor device structure.

FIG. 1 is a flowchart of a method 10 for forming a semiconductor device structure in accordance with some embodiments. It should be understood that additional processes may be provided before, during, and/or after the method 10 of FIG. 1, and that some of the stages described may be replaced or omitted. In some embodiments, additional features may be added to the semiconductor device structure. In some embodiments, some of the features described may be replaced or omitted. FIGS. 2A-2J are cross-sectional views of a semiconductor device structure formed by using the method 10 as shown in FIG. 1 at various stages of fabrication in accordance with some embodiments.

Figure 2A:
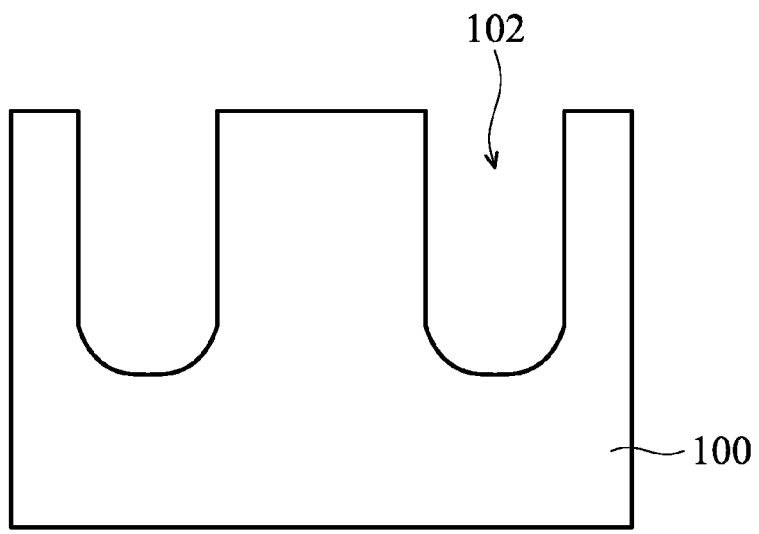
FIGS. 2A-2J are cross-sectional views of a semiconductor device structure formed by using the method as shown in FIG. 1 at various stages of fabrication in accordance with some embodiments.

Referring to FIG. 1 and FIG. 2A, the method 10 for forming a semiconductor device structure starts with step 12, in which a trench 102 is formed in a substrate 100. The substrate 100 may include semiconductor elementary semiconductor materials, compound semiconductor materials, alloy semiconductor materials or a combination thereof. Examples of the elementary semiconductor materials may include, but are not limited to, monocrystalline, polycrystalline and amorphous silicon and germanium. Examples of the compound semiconductor materials may include, but are not limited to, gallium nitride, silicon carbide, gallium arsenic, gallium phosphide, indium phosphide, indium arsenide and indium antimonide. Examples of the alloy semiconductor materials may include, but are not limited to SiGe, GaAsP, AlInAs, AlGaAs, GaInAs, GaInP and GaInAsP. In some embodiments, the trench 102 may be formed by using one or more lithography and etching processes.

Figure 2B:
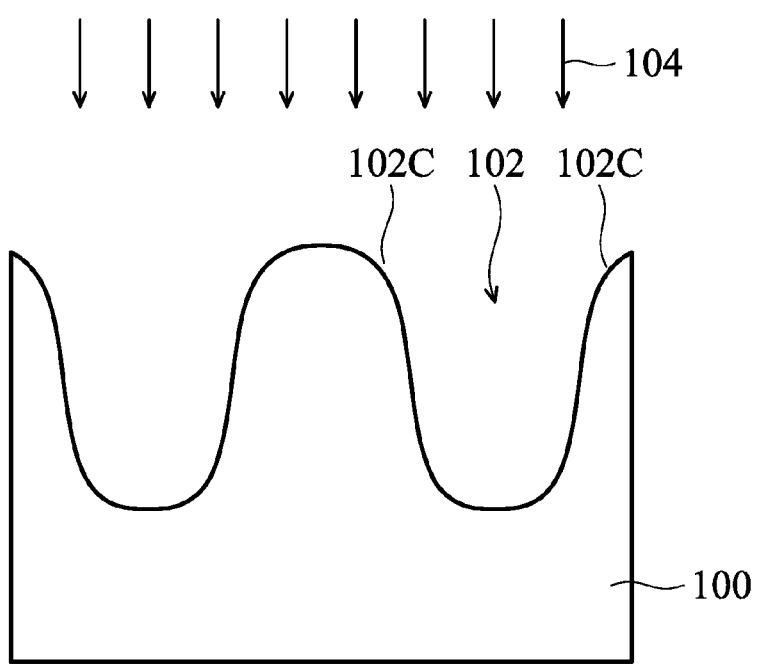

Referring to FIG. 1 and FIG. 2B, in some embodiments, the method 10 for forming a semiconductor device structure may include step 14, in which an etching process 104 is performed to round the top corners 102C of the trench 102. The top corners 102C are located at two sides of the top portion of the trench 102. Due to the rounded top corners 102C, a width of the top portion of the trench 102 is greater than the width of the bottom portion of the trench 102. In other words, the trench 102 has an expanded top portion. The etching process described may include dry etching, wet etching, another suitable etching process, or a combination thereof. Examples of dry etching may include, but are not limited to, reactive ion etching (RIE) and plasma etching. In some embodiments, the etching process 104 may be a soft etching process, which is a low-energy/low-damage plasma etching process causing less damage to the substrate compared to general etching processes.

Moreover, in some embodiments, a sacrificial oxide layer (not shown) optionally may be conformally formed on the trench 102 and then removed so as to eliminate damage to the substrate caused by the process for forming the trench (for example, damage caused by the etching process).

Figure 2C:
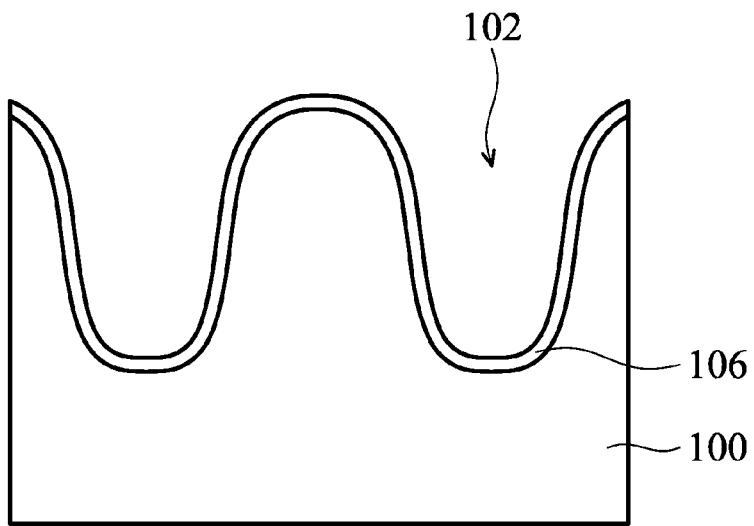

Next, referring to FIG. 1 and FIG. 2C, in step 16, a gate dielectric layer 106 lining the trench 102 is formed. In some embodiments, the gate dielectric layer 106 may include dielectric materials such as silicon oxides, silicon nitrides, silicon oxynitrides, high dielectric constant (high-k) materials and combinations thereof. The gate dielectric layer 106 may be metal oxides, metal nitrides, metal silicates, transition metal-oxides, transition metal-nitrides, transition metal-silicates, oxynitrides of metals, or aluminates of metals. Examples of the high-k dielectric material may include, but are not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfSiO, HfTaTiO, HfAlON, $(Ba,Sr)TiO_3$(BST), $Al_2O_3$, or a combination thereof.

In some embodiments, the gate dielectric layer 106 may be formed by using a thermal oxidation process, chemical vapor deposition (CVD) process, spin coating process, atomic layer deposition (ALD) process, another suitable process, or a combination thereof.

Figure 2D:
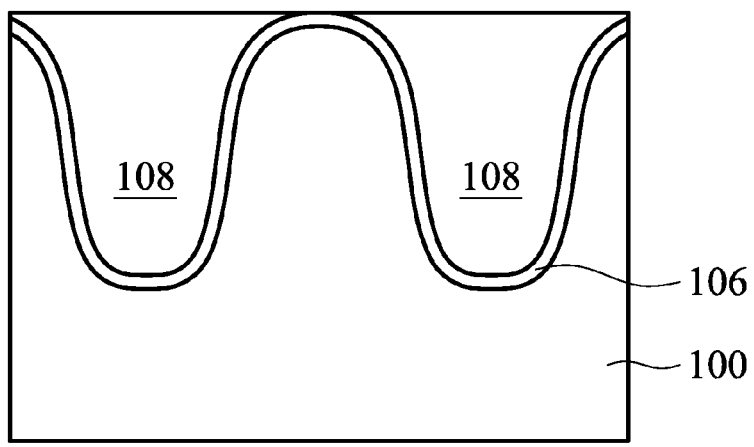

Next, referring to FIG. 1 and FIG. 2D, in step 18, the trench 102 is filled with a gate material 108. The gate material 108 may include, but is not limited to, polycrystalline silicon, amorphous silicon, metals, or a combination thereof. In some embodiments, the gate material 108 is deposited to cover the substrate 100 and the trench 102, and a planarization process is performed until a substrate surface between the trenches 102 is exposed. Thereafter, the trench 102 is filled with the gate material 108.

In some embodiments, the gate material 108 may be formed by using a chemical vapor deposition (CVD) process, spin coating process, atomic layer deposition (ALD) process, physical vapor deposition (PVD) process, another suitable process, or a combination thereof. Moreover, the planarization process may include, but is not limited to, a chemical mechanical planarization (CMP) process, a mechanical polishing process, an etching process, or a combination thereof.

Furthermore, a metal silicide layer (not shown) may be formed on the top portion of gate material 108. The metal silicide layer may include, but is not limited to, nickel silicide, cobalt silicide, tungsten silicide, titanium silicide, tantalum silicide, platinum silicide, erbium silicide, or a combination thereof.

Figure 2E:
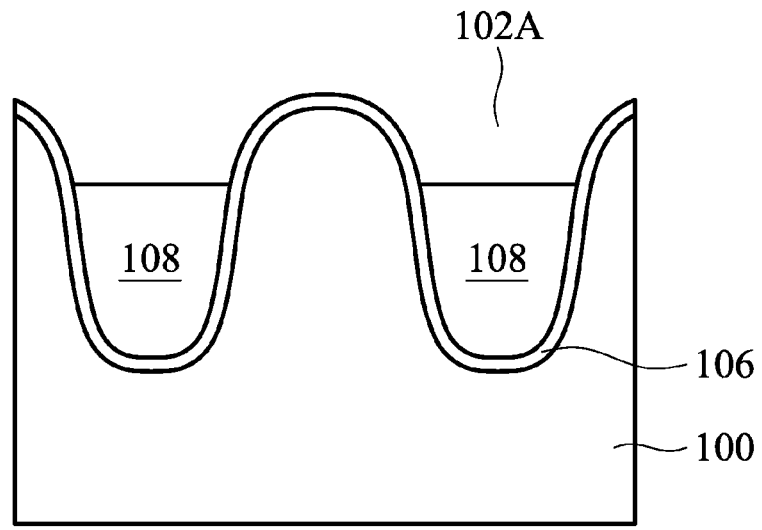
Figure 2F:
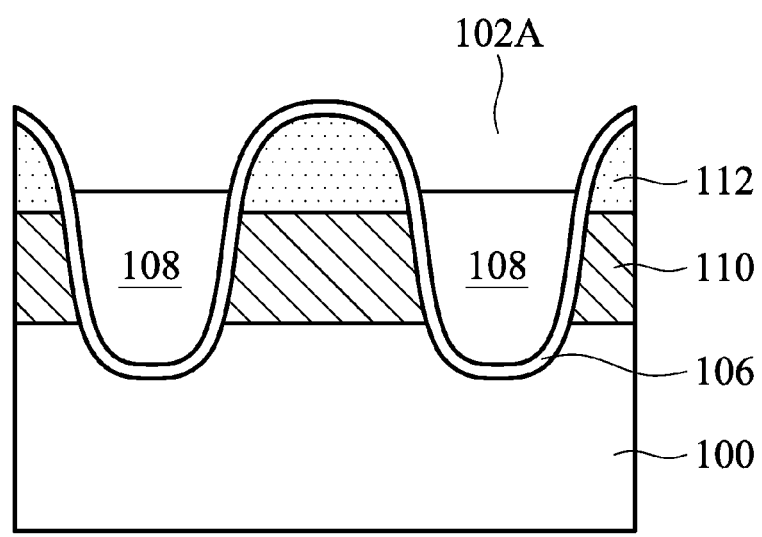

Referring to FIG. 1 and FIGS. 2E-2F. In step 20, the gate material 108 is etched back to expose an upper portion 102A of the trench 102. Thereafter, step 22 may be performed, in which a body region 110 and a source region 112 are formed in the substrate 100 between trenches 102. The source region 112 is located above the body region 110. The body region 110 may serve as a channel region of the semiconductor device structure. In some embodiments, the body region 110 may include p-type dopants (such as boron or indium), and the source region 112 may include n-type dopants (such as phosphorous or arsenic).

The body region 110 and the source region 112 may be formed by using an ion implantation process. The depth of the source region 112 may be greater than the depth of the exposed upper portion 102A of the trench 102. In some embodiments, the body region 110 may be formed first, and then the source region 112 is formed above the body region 110. Nevertheless, in some other embodiments, the source region 112 may be formed in the substrate 100 first, and then the body region 110 is formed below the source region 112 by high-energy ion implantation.

In some embodiments, an annealing process then may be performed to activate the dopant formed by implantation and to decrease dopant diffusion in the body region 110 and the source region 112. In some embodiments, the annealing process may be, but is not limited to, a rapid thermal annealing (RTA) process.

Moreover, it should be understood that the step of forming the body region 110 and the source region 112 in the substrate 100 between the trenches 102 may also be performed at other stages of the fabrication as long as the body region 110 and the source region 112 may be formed. For example, the body region 110 and the source region 112 may be formed in the substrate after the step of performing a chemical mechanical planarization (CMP) process until the substrate surface between the trenches is exposed (step 26, as described below).

Figure 2G:
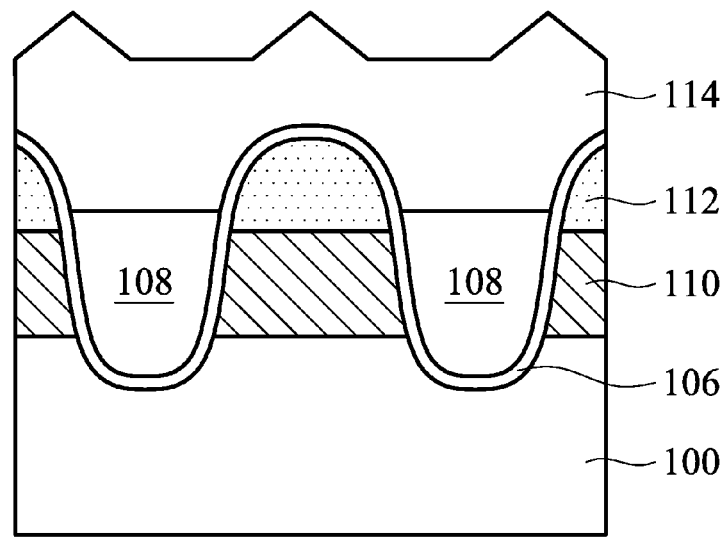

Next, referring to FIG. 1 and FIG. 2G, in step 24, a dielectric layer 114 is formed to refill the upper portion 102A of the trench 102 and cover the substrate 100 between the trenches including the top portion and the sidewall of the substrate 100 between the trenches 102. The dielectric layer 114 may electrically isolate the gate material 108 from the conductive elements that will be formed in the following step. The dielectric layer 114 may include, but is not limited to, silicon oxides, silicon nitrides, silicon oxynitrides, borophosphosilicate glass (BPSG), phosphosilicate glass (PSG), spin-on glass (SOG), another suitable dielectric material, or a combination thereof.

In some embodiments, the dielectric layer 114 may be formed by using a chemical vapor deposition (CVD) process, spin coating process, atomic layer deposition (ALD) process, physical vapor deposition (PVD) process, another suitable process, or a combination thereof. In some embodiments, the dielectric layer 114 is formed by using a high density plasma chemical vapor deposition (HDP CVD) process, as shown in FIG. 2G.

Figure 2H:
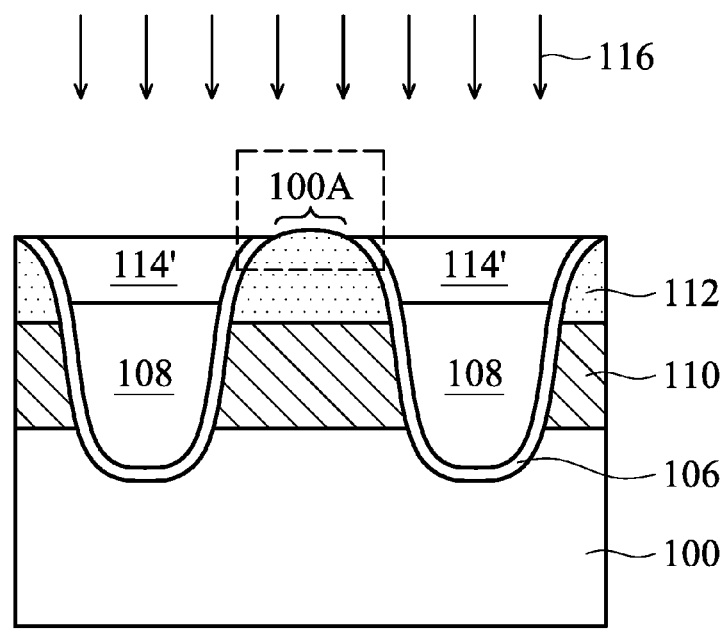
Figure 2:
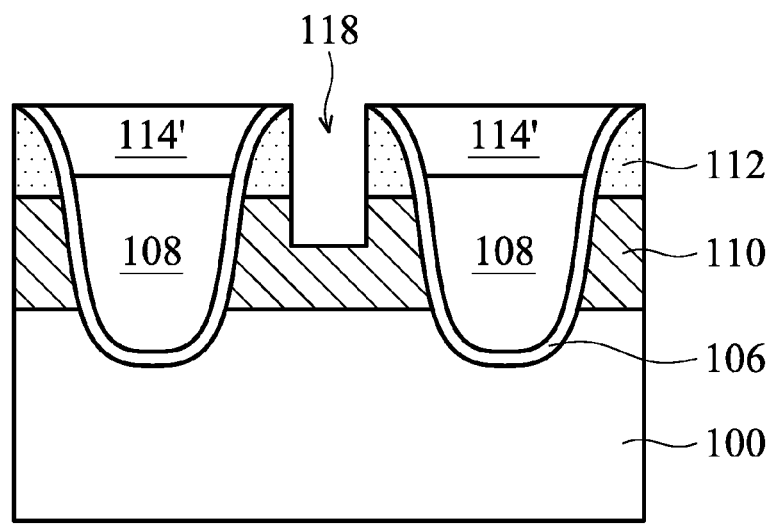
Figure 2:
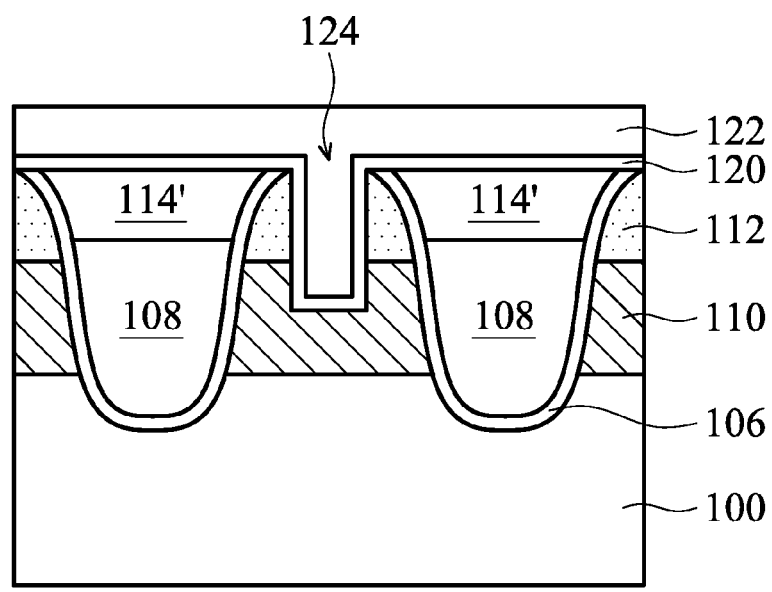

Next, referring to FIG. 1 and FIG. 2H, in step 26, a chemical mechanical planarization (CMP) process 116 is performed to partially remove the dielectric layer 114 until the substrate surface 100A between the trenches 102 is exposed. After the chemical mechanical planarization process 116 is performed, a portion of the dielectric layer 114' remains in the upper portion 102A of the trench 102. Additionally, the chemical mechanical planarization process 116 also partially removes the gate dielectric layer 106.

Herein, the chemical mechanical planarization process 116 having high selectivity between the dielectric layer 114 and the substrate 100 may be used so as to selectively remove the dielectric layer 114 without removing the substrate 100. In some embodiments, the exposed substrate surface 100A may be located at the mesa region of the substrate 100. The mesa region is the protruding region of the top portion of the substrate 100, as shown in the region denoted by the dashed block in FIG. 2H.

Next, referring to FIG. 1 and FIG. 2I, in step 28, by using the dielectric layer 114' formed in the upper portion 102A of the trenches 102 as an etching mask, the substrate 100 is etched through the exposed substrate surface 100A to form a self-aligned contact opening 118 between the trenches 102.

In other words, the contact opening 118 is defined by the dielectric layer 114' which remains in the upper portion 102A of the trench 102. Therefore, the contact opening 118 is formed as a self-aligned contact opening. Moreover, the contact opening 118 penetrates through the source region 112 formed in the substrate 100 and extends to the body region 110.

Herein, the chemical mechanical planarization process having high selectivity between the dielectric layer 114 and the substrate 100 may be used so as to selectively remove the substrate 100 without removing the dielectric layer 114. In some embodiments, the etching process described may be, but is not limited to, dry etching. Examples of dry etching may include reactive ion etching (RIE), plasma etching, another suitable anisotropic etching process, or a combination thereof.

Furthermore, a contact barrier layer 120 and a conductive material 122 may be formed in the contact opening 118 so as to form a contact plug contact structure 124, as shown in FIG. 2J. The materials of the contact barrier layer 120 may include, but are not limited to, Co, Ta, CoWP, Ti, TaN, Ru, or a combination thereof. The conductive material 122 may include, but is not limited to, Al, Cu, W, Ti, Ta, titanium nitride (TiN), tantalum nitride (TaN), nickel silicide (NiSi), cobalt silicide (CoSi), tantulum carbide (TaC), tantulum silicide nitride (TaSiN), tantalum carbide nitride (TaCN), titanium aluminide (TiAl), titanium aluminide nitride (TiAlN), another suitable metal, or a combination thereof.

In some embodiments, the contact barrier layer 120 and the conductive material 122 may be formed by using a chemical vapor deposition (CVD) process, spin coating process, atomic layer deposition (ALD) process, physical vapor deposition (PVD) process, another suitable process, or a combination thereof.

Figure 3:
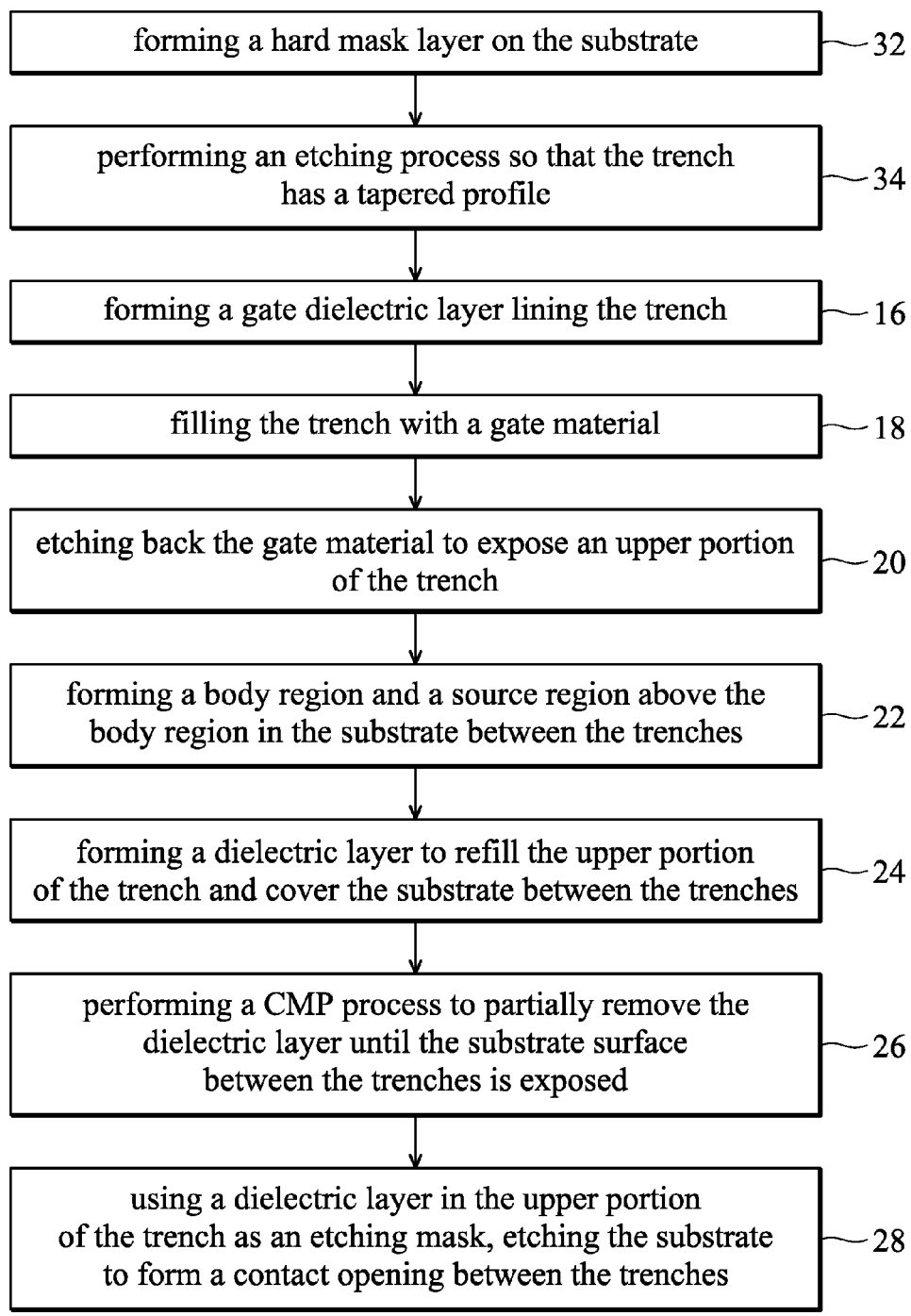
FIG. 3 is a flowchart of an exemplary method for forming a semiconductor device structure in accordance with some embodiments.
Figure 4A:
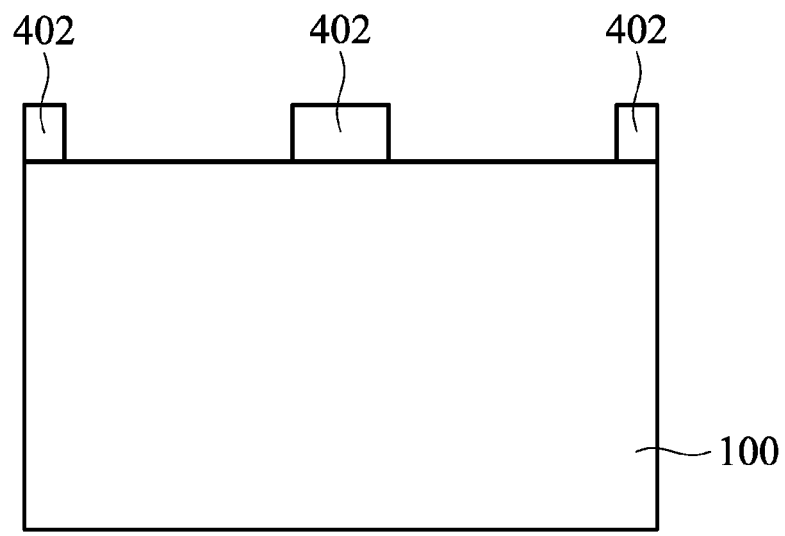
FIGS. 4A-4C are cross-sectional views of a semiconductor device structure formed by using the method as shown in FIG. 3 at various stages of fabrication in accordance with some embodiments.
Figure 4B:
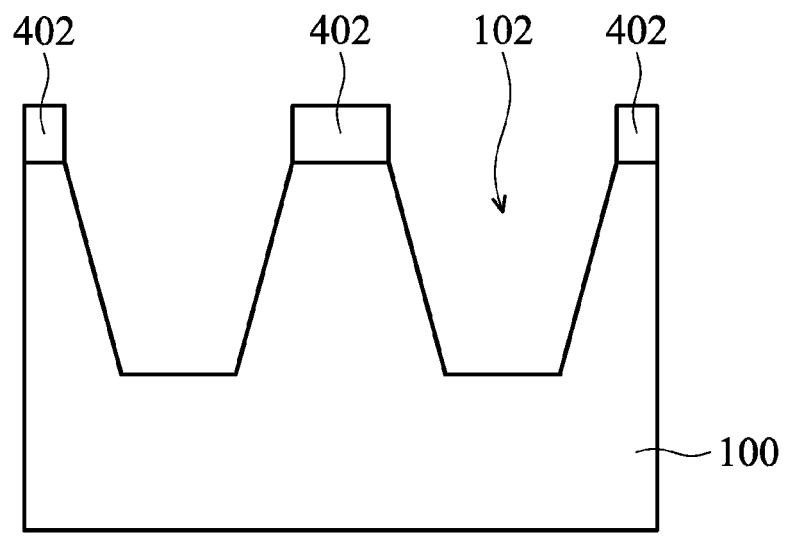
Figure 4C:
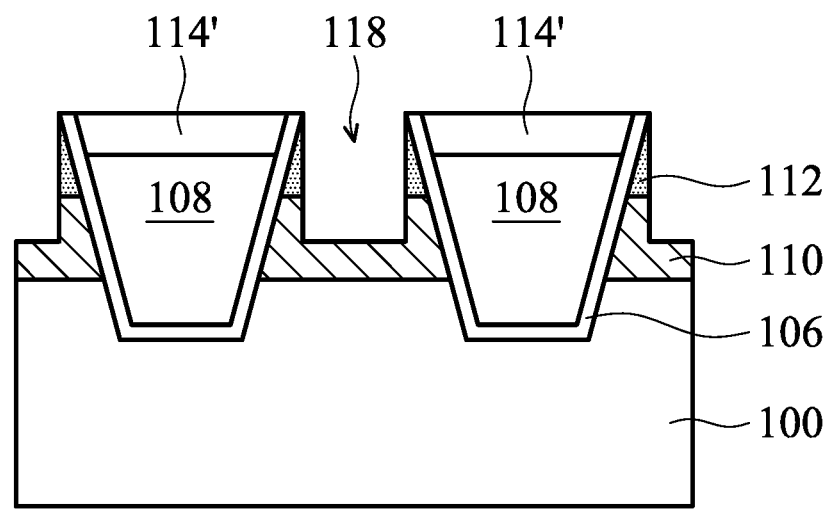

FIG. 3 is a flowchart of a method 30 for forming a semiconductor device structure in accordance with some other embodiments. FIGS. 4A-4C are cross-sectional views of a semiconductor device structure formed by using the method as shown in FIG. 3 at various stages of fabrication in accordance with some embodiments. The same reference numerals used in FIGS. 4A-4C and FIGS. 2A-2J represent the same or similar components and are not repeated herein.

Referring to FIG. 3 and FIG. 4A, the method 30 for forming a semiconductor device structure starts with step 32, in which a patterned hard mask layer 402 is formed on the substrate 100. The patterned hard mask layer 402 may be used to define the position of the trenches 102 that will be formed in the following step. The materials of the hard mask layer 402 may include, but are not limited to, silicon oxides, silicon nitrides, silicon oxynitrides, silicon carbides, or a combination thereof. The hard mask layer 402 may include single or multiple material layers.

In some embodiments, the hard mask layer 402 may be formed by using a chemical vapor deposition (CVD) process, atomic layer deposition (ALD) process, thermal oxidation process, physical vapor deposition (PVD) process, another suitable process, or a combination thereof.

Examples of the chemical vapor deposition process may include, but are not limited to, a low-pressure chemical vapor deposition (LPCVD) process and a plasma enhanced chemical vapor deposition (PECVD) process. Moreover, the hard mask layer 402 may be patterned by using one or more lithography and etching processes.

Next, referring to FIG. 3 and FIG. 4B, in step 34, by using the patterned hard mask layer 402 as an etching mask, the substrate 100 is partially removed by an etching process so that the trench 102 has a tapered profile. As shown in FIG.

4B, the sidewall of the trench 102 is slanted. The width of the etched top portion of the trench 102 is greater than the width of the bottom portion of the trench 102. In other words, the trench 102 has an expanded top portion. In some embodiments, the etching process described may include dry etching, wet etching, another suitable etching process, or a combination thereof. Examples of dry etching may include, but are not limited to, reactive ion etching (RIE) and plasma etching.

Next, after the hard mask layer 402 is removed, steps 16-28 of the method 10 are performed to finish the method 30 for forming the semiconductor device structure. That is, forming a gate dielectric layer 106 lining the trench 102 (step 16); filling the trench 102 with a gate material 108 (step 18); etching back the gate material 108 to expose an upper portion 102A of the trench 102 (step 20); forming a body region 110 and a source region 112 in the substrate 100 between the trenches 102 (step 22); forming a dielectric layer 114 to refill the upper portion 102A of the trench 102 and cover the substrate 102 between the trenches 102 (step 24); performing a chemical mechanical planarization process 116 to partially remove the dielectric layer 114 until the substrate surface between the trenches 102 is exposed (step 26); using a dielectric layer 114' in the upper portion 102A of the trench 102 as an etching mask, etching the substrate 100 to form a self-aligned contact opening 118 between the trenches 102 (step 28). The semiconductor device structure formed by using the method 30 is shown in FIG. 4C. The semiconductor device structure has the self-aligned contact opening 118 which is defined by the dielectric layer 114' formed in the upper portion 102A of the trench 102.

Figure 5:
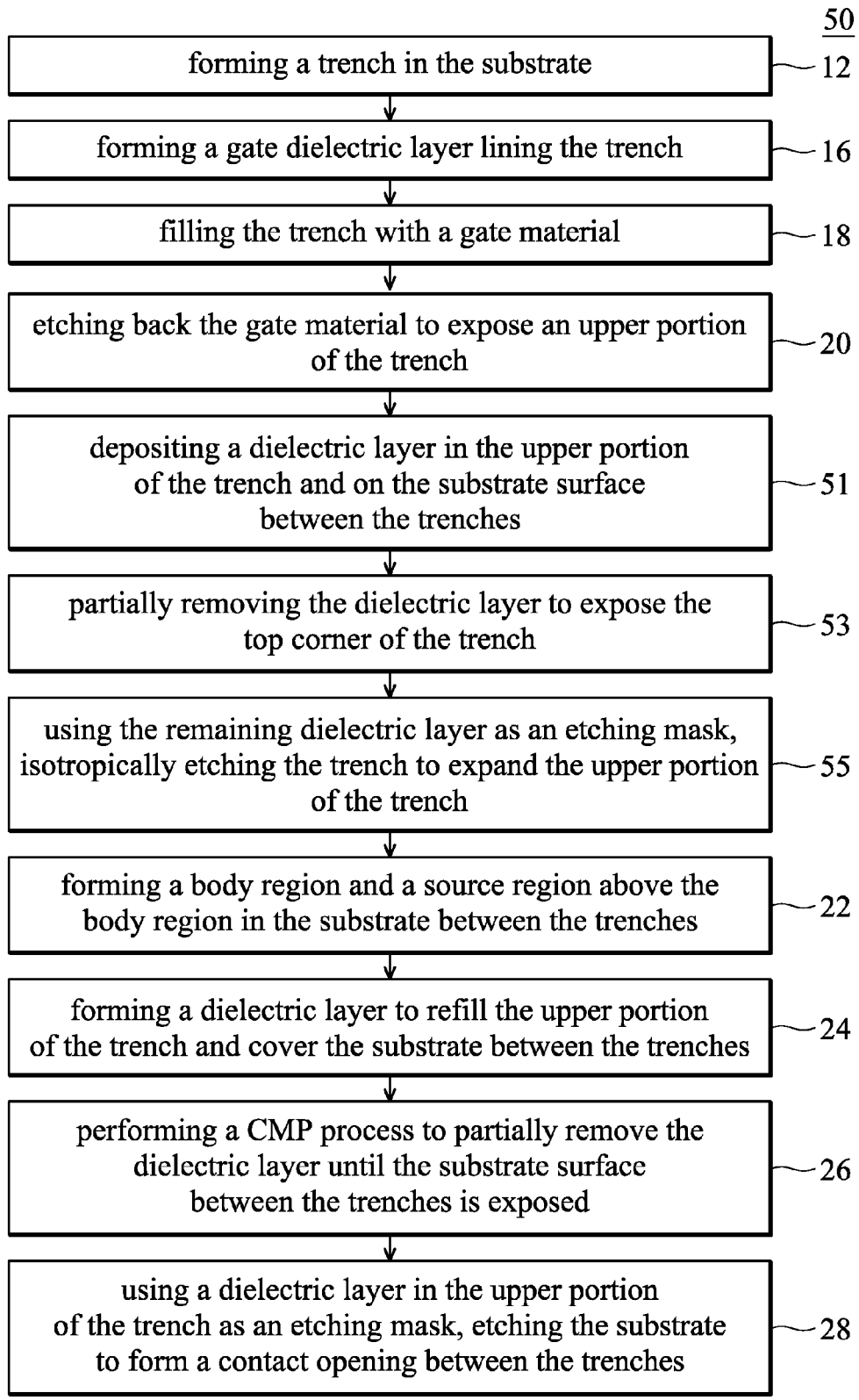
FIG. 5 is a flowchart of an exemplary method for forming a semiconductor device structure in accordance with some embodiments.

FIG. 5 is a flowchart of a method 50 for forming a semiconductor device structure in accordance with some other embodiments. FIGS. 6A-6F are cross-sectional views of a semiconductor device structure formed by using the method 50 shown in FIG. 5 at various stages of fabrication in accordance with some embodiments. The same reference numerals used in FIGS. 6A-6F and FIGS. 2A-2J represent the same or similar components and are not repeated herein.

Figure 6A:
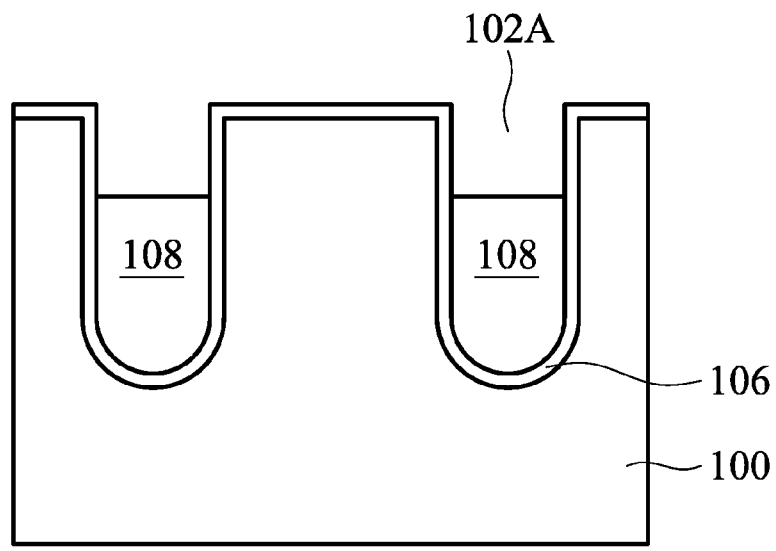
FIGS. 6A-6F are cross-sectional views of a semiconductor device structure formed by using the method as shown in FIG. 5 at various stages of fabrication in accordance with some embodiments.

Referring to FIG. 5, the method 50 of forming a semiconductor device structure proceeds from step 20 of the method 10 (FIG. 2E) but without performing the step of rounding the top corner of the trench. That is, forming a trench 102 in the substrate 100 (step 12); forming a gate dielectric layer 106 lining the trench 102 (step 16); filling the trench 102 with a gate material 108 (step 18); etching back the gate material 108 to expose an upper portion 102A of the trench 102 (step 20). At this point, the semiconductor device structure formed is as shown in FIG. 6A. The gate material 108 that is etched back exposes the upper portion 102A of the trench 102.

Figure 6B:
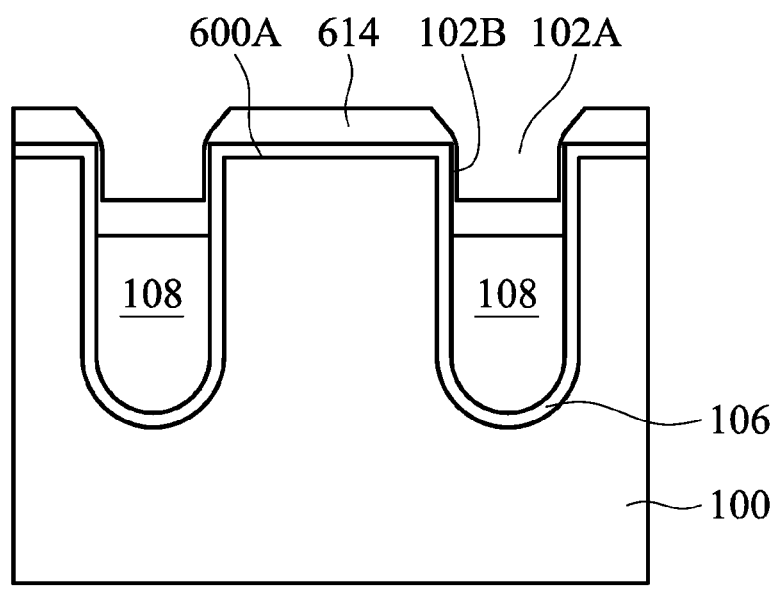

Next, referring to FIGS. 5 and 6B, in step 51, the dielectric layer 614 is formed in the upper portion 102A of the trench 102 and on the substrate surface 600A between the trenches 102 by using high density plasma chemical vapor deposition (HDP CVD) process. The upper portion 102A of the trench 102 is not completely filled with the dielectric layer 614. In some embodiments, the dielectric layer 614 formed on the substrate surface 600A has a slanted edge and it does not align with the sidewall of the trench 102.

Moreover, a portion of the dielectric layer 614 is also formed on the sidewall 102B of the upper portion 102A of the trench 102. Since the HDP CVD process features mainly depositing on the bottom and top portions of a trench, the thickness of the dielectric layer 614 formed on the sidewall 102B of the trench is much thinner than the thickness of the dielectric layer 614 formed in the upper portion 102A of the trench and the thickness of the dielectric layer 614 formed on the substrate surface 600A.

Figure 6C:
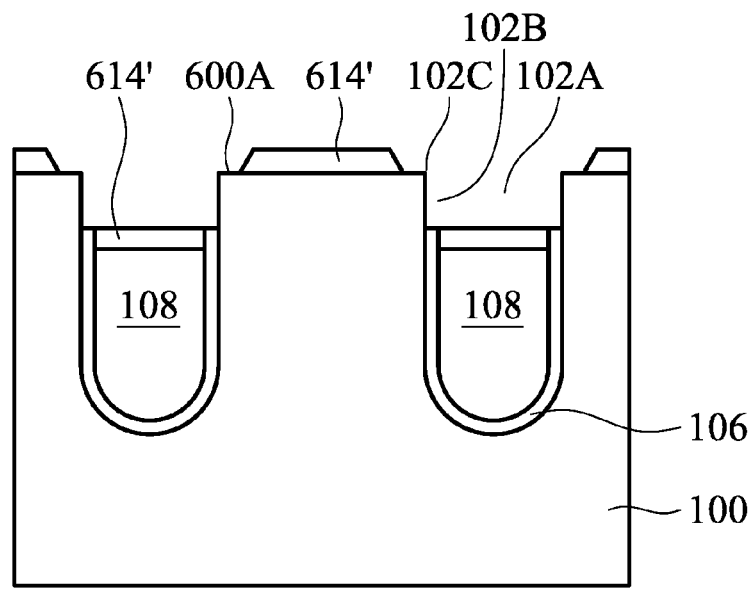

Next, referring to FIGS. 5 and 6C, in step 53, the dielectric layer 614 is partially removed by etching back to expose the top corner 102C of the trench 102. As shown in FIG. 6C, the dielectric layer 614 formed on the sidewall 102B of the upper portion of the trench is completely removed, while a portion of the dielectric layer 614' remains in the upper portion 102A of the trench 120 and on the substrate surface 600A. In some embodiments, the dielectric layer 614 may be removed by using dry etching, wet etching, another suitable etching process, or a combination thereof. Examples of dry etching may include, but are not limited to, reactive ion etching (RIE) and plasma etching.

Figure 6D:
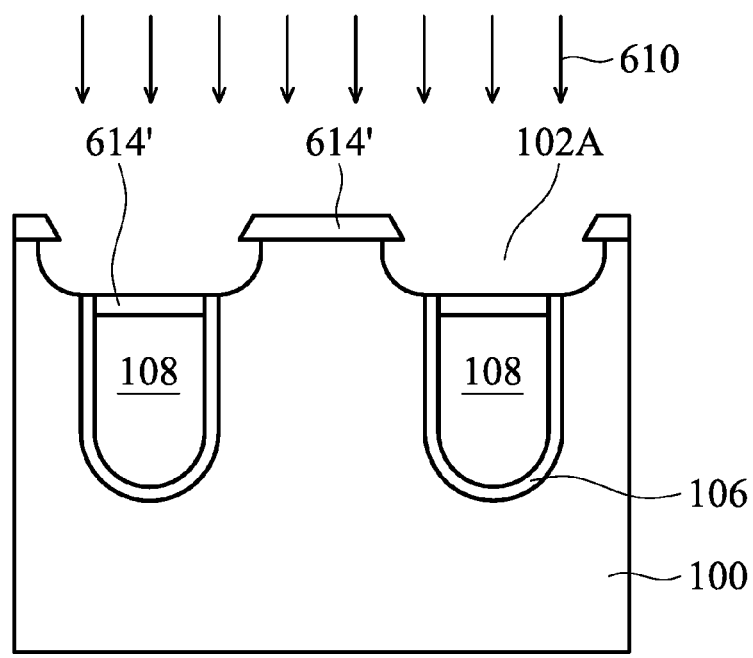

Next, referring to FIG. 5 and FIG. 6D, in step 55, by using the remaining dielectric layer 614' as an etching mask, the trench 102 is isotropically etched to expand the upper portion 102A of the trench 102. As shown in FIG. 6D, the top corner 102C of the trench 102, and the gate dielectric layer 106 and the substrate 100 adjacent to the upper portion 102A of the trench 102 are removed by the isotropically etching process 610. The width of the expanded upper portion 102A of the trench 102 is greater than the original width of the trench 102. In other words, due to the expanded upper portion 102A of the trench, the width of the top portion of the trench 102 is greater than the width of the bottom portion of the trench 102.

Figure 6E:
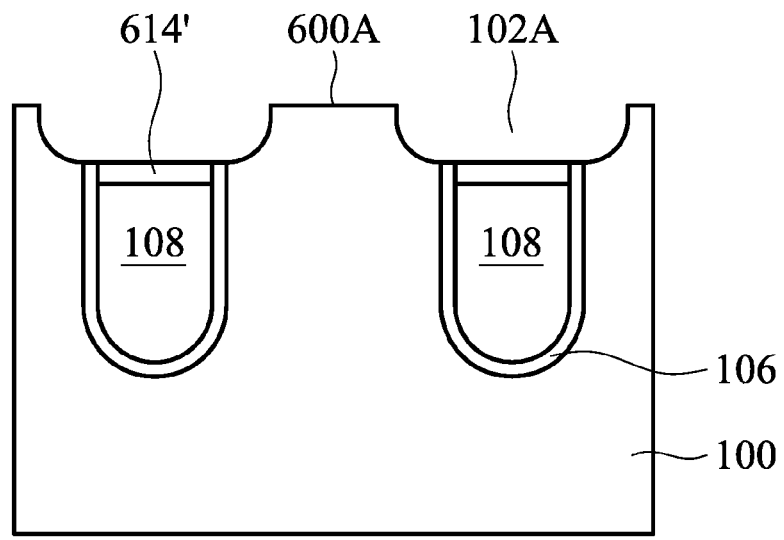

Additionally, in some embodiments, the chemical mechanical planarization process optionally may be performed to remove the remaining dielectric layer 614' until the substrate surface 600A between the trenches 102 is exposed. The dielectric layer 614' in the upper portion 102A of the trench 102 is kept and not being removed, as shown in FIG. 6E.

Figure 6F:
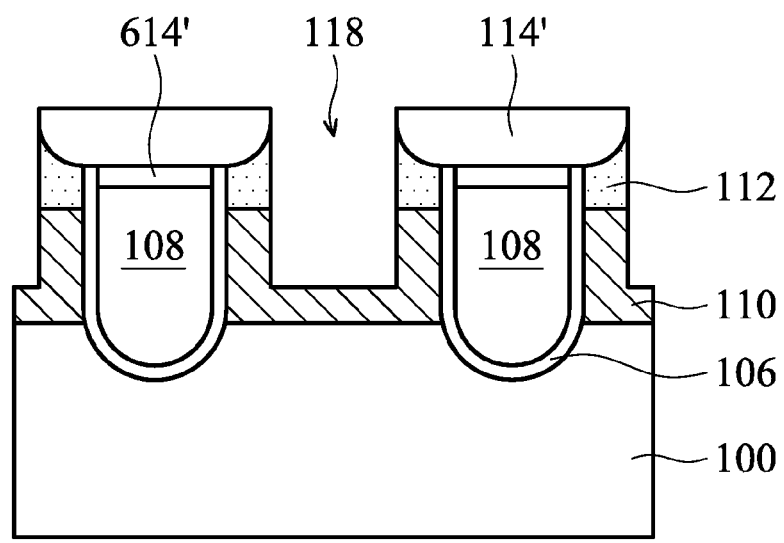

Steps 22-28 of the method 10 are then performed to finish the method 50 for forming the semiconductor device structure. That is, forming a body region 110 and a source region 112 in the substrate 100 between the trenches 102 (step 22); forming a dielectric layer 114 to refill the upper portion 102A of the trench 102 and cover the substrate 102 between the trenches 102 (step 24); performing a chemical mechanical planarization process 116 to partially remove the dielectric layer 114 until the substrate surface between the trenches 102 is exposed (step 26); using a dielectric layer 114' in the upper portion 102A of the trench 102 as an etching mask; and etching the substrate 100 to form a self-aligned contact opening 118 between the trenches 102 (step 28). The semiconductor device structure formed by using the method 50 is shown in FIG. 6F. The semiconductor device structure has a self-aligned contact opening 118 which is defined by the dielectric layer 114' formed in the upper portion 102A of the trench 102.

Figure 7:
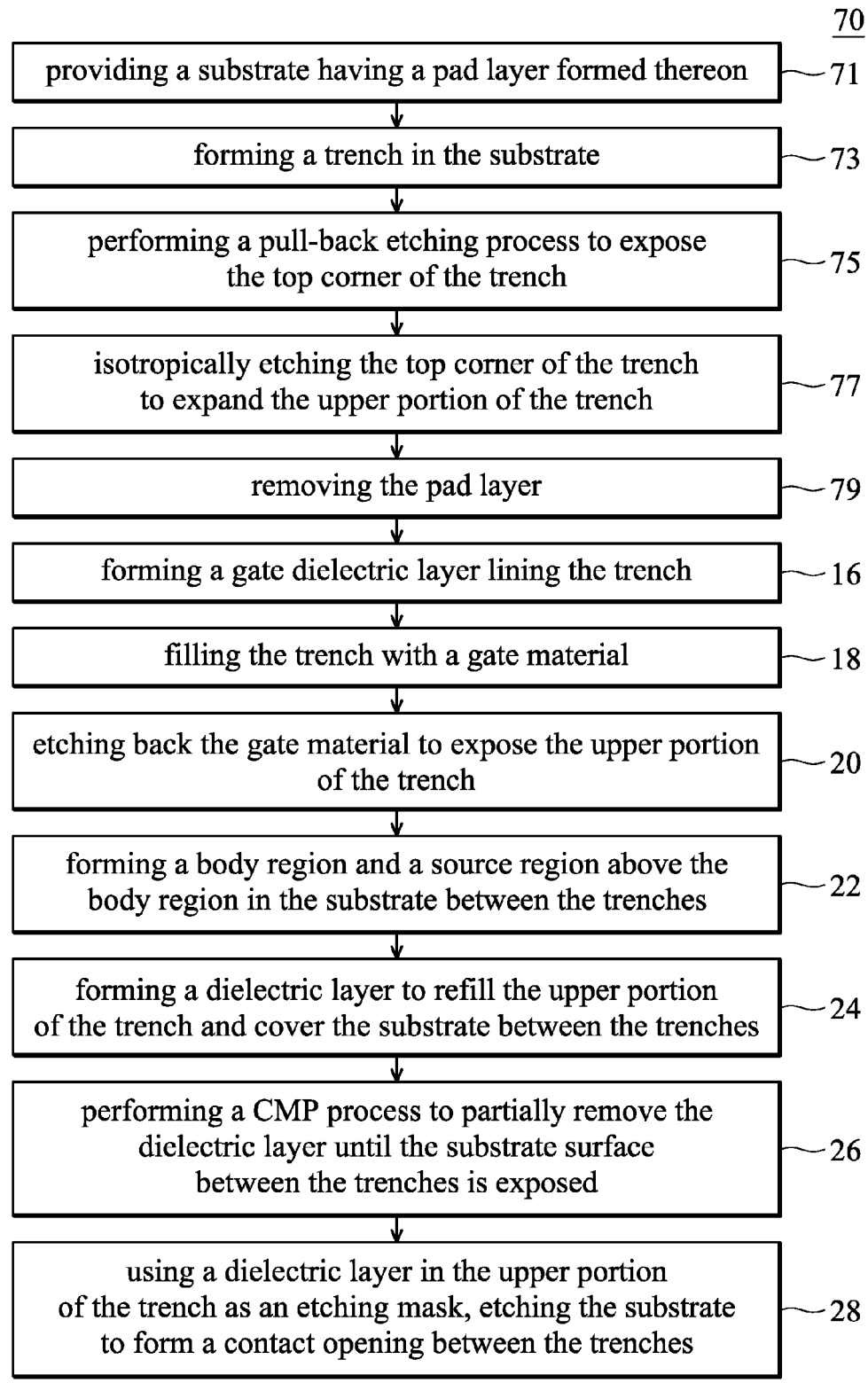
FIG. 7 is a flowchart of an exemplary method for forming a semiconductor device structure in accordance with some embodiments.

FIG. 7 is a flowchart of a method 70 for forming a semiconductor device structure in accordance with some other embodiments. FIGS. 8A-8F are cross-sectional views of a semiconductor device structure formed by using the method 70 as shown in FIG. 7 at various stages of fabrication in accordance with some embodiments. The same reference numerals used in FIGS. 8A-6F and FIGS. 2A-2J represent the same or similar components and are not repeated herein.

Figure 8A:
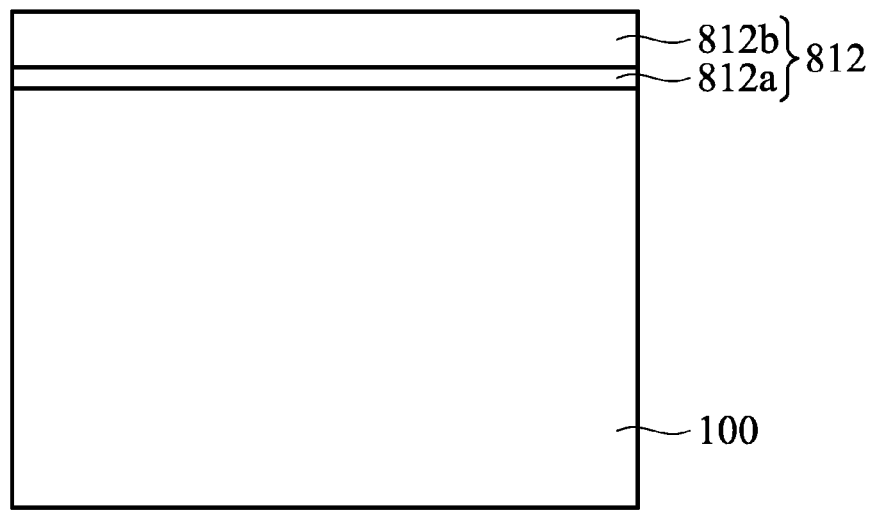
FIGS. 8A-8F are cross-sectional views of a semiconductor device structure formed by using the method as shown in FIG. 7 at various stages of fabrication in accordance with some embodiments.

Referring to FIG. 7 and FIG. 8A, the method 70 for forming a semiconductor device structure starts with step 71, in which a substrate 100 is provided. A pad layer 812 is formed on the substrate 100. The pad layer 812 may include single or multiple layers. The materials of the pad layer 812 may include oxides, nitrides, another suitable material, or a combination thereof. Examples of the pad layer 812 may include, but are not limited to, silicon oxides, silicon nitrides, and silicon oxynitrides. As shown in FIG. 8A, in some embodiments, the pad layer 812 includes a pad oxide layer 812a and a pad nitride layer 812b formed on the pad oxide layer 812a. In some other embodiments, the pad layer 812 may be a single-layered structure including the pad oxide layer 812a only.

In some embodiments, the pad layer 812 may be formed by using a chemical vapor deposition (CVD) process, thermal oxidation process, another suitable process, or a combination thereof. Examples of the chemical vapor deposition process may include, but are not limited to, a low-pressure chemical vapor deposition (LPCVD) process and a plasma enhanced chemical vapor deposition (PECVD) process.

Figure 8B:
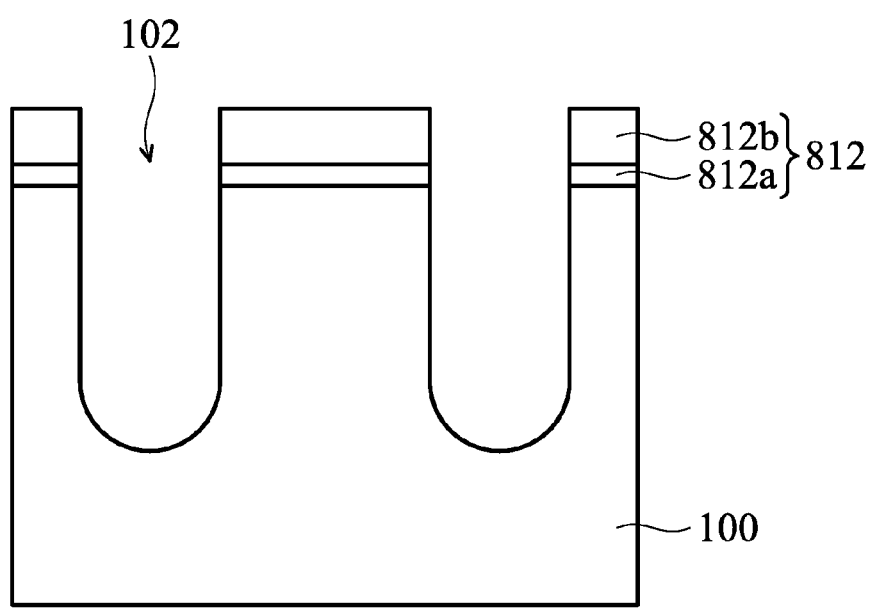

Next, referring to FIG. 7 and FIG. 8B, in step 73, the trench 102 is formed in the substrate 100. As shown in FIG. 8B, the trench 102 penetrates through the pad oxide layer 812a and the pad nitride layer 812b, and extends to the substrate 100. The trench 102 may be formed by using one or more lithography and etching processes.

Figure 8C:
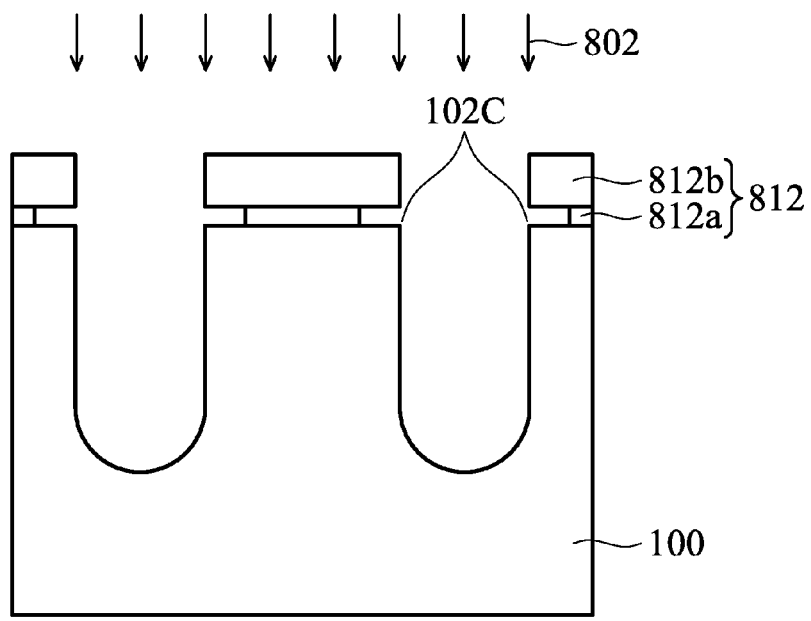

Next, referring to FIG. 7 and FIG. 8C, in step 75, a pull-back etching process 802 is performed to partially remove the pad layer 812 adjacent to the trench 102 so that the top corner 102C of the trench is exposed and the trench 102 is extended into the pad layer 812. In some embodiments, the pull-back etching process 802 removes the pad oxide layer 812a adjacent to the trench 102 without removing the pad nitride layer 812b. As a result, the pad layer 812 has an indented portion. Moreover, the pull-back etching process 802 may include wet etching, another suitable etching process, or a combination thereof.

Figure 8D:
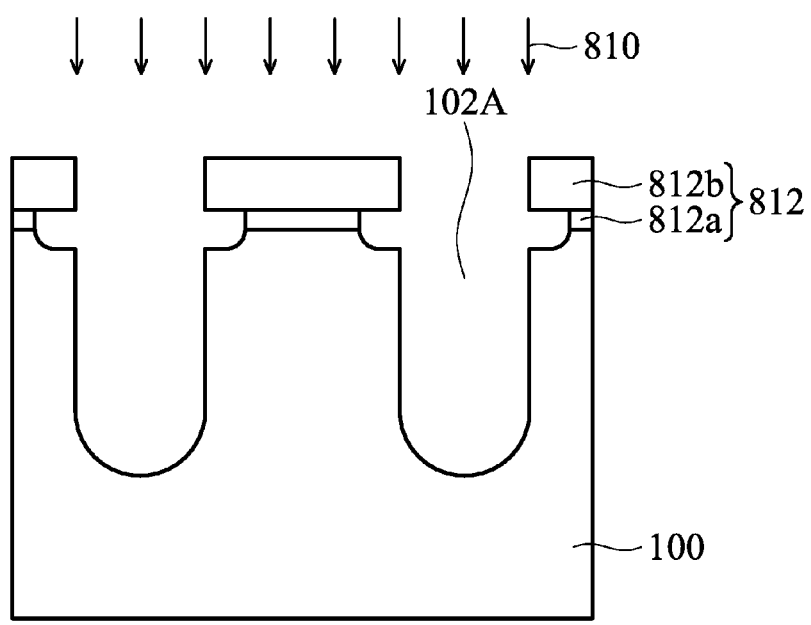

Next, referring to FIG. 7 and FIG. 8D, in step 77, the top corner 102C of the trench 102 is isotropically etched to expand the upper portion 102A of the trench. As shown in FIG. 8D, by using the pad layer 812 as an etching mask, the top corner 102C of the trench and a portion of the substrate 100 adjacent to the upper portion 102A of the trench 102 are removed by the isotropically etching process 810.

The width of the expanded upper portion 102A of the trench 102 is greater than the original width of the trench 102. In other words, due to the expanded upper portion 102A of the trench, the overall width of the top portion of the trench 102 is greater than the width of the bottom portion of the trench 102. Moreover, in some embodiments, the edge of the indented portion of the pad oxide layer 812a aligns with the outer boundary of the expanded upper portion 102A of the trench.

Figure 8E:
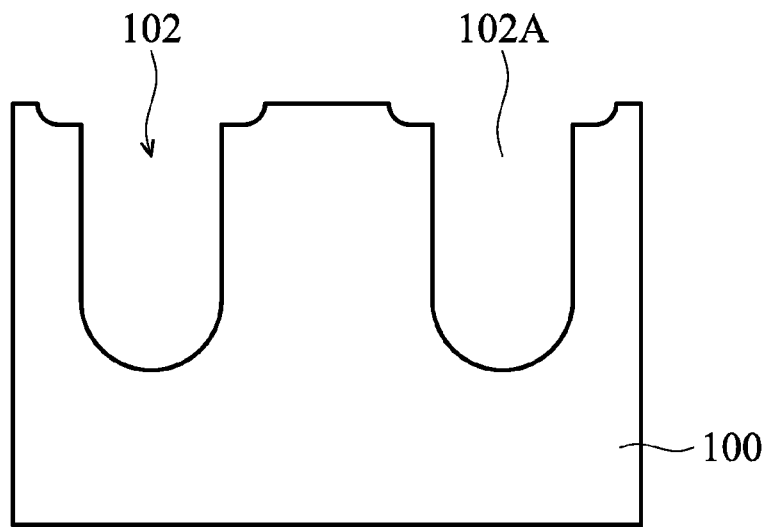
Figure 8F:
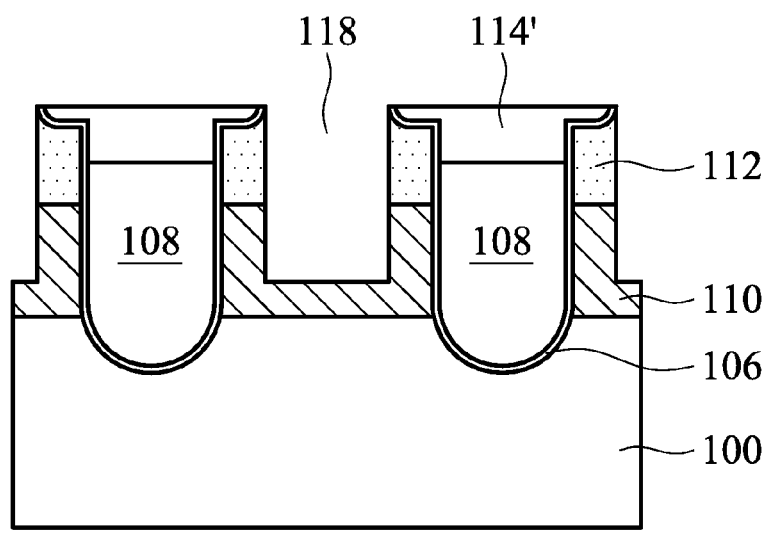

Next, referring to FIG. 7 and FIG. 8E, in step 79, the pad layer 812 is removed and the expanded upper portion 102A of the trench 102 is exposed. The pad layer 812 may be removed by using a chemical mechanical planarization process, mechanical polishing process, etching process, another suitable process, or a combination thereof. Steps 16-28 of the method 10 are then performed to finish the method 70 for forming the semiconductor device structure. That is, forming a gate dielectric layer 106 lining the trench 102 (step 16); filling the trench 102 with a gate material 108 (step 18); etching back the gate material 108 to expose an upper portion 102A of the trench 102 (step 20); forming a body region 110 and a source region 112 in the substrate 100 between the trenches 102 (step 22); forming a dielectric layer 114 to refill the upper portion 102A of the trench 102 and cover the substrate 102 between the trenches 102 (step 24); performing a chemical mechanical planarization process 116 to partially remove the dielectric layer 114 until the substrate surface between the trenches 102 is exposed (step 26); using a dielectric layer 114' in the upper portion 102A of the trench 102 as an etching mask, etching the substrate 100 to form a self-aligned contact opening 118 between the trenches 102 (step 28). The semiconductor device structure formed by using the method 70 is shown in FIG. 8F. The semiconductor device structure has the self-aligned contact opening 118 which is defined by the dielectric layer 114' formed in the upper portion 102A of the trench 102.

To summarize the above, in accordance with embodiments of the present disclosure, the method for forming a semiconductor device structure uses a chemical mechanical planarization process having high selectivity so that a specific substrate surface (for example, the substrate surface located at the mesa region of the substrate) is exposed by the dielectric layer. The method also uses an etching process having high selectivity to form a self-aligned contact opening in the substrate through such a specific substrate surface.

The method for forming a semiconductor device structure in accordance with embodiments of the present disclosure may overcome the problem of misalignment that may occur when traditional lithography machines are used for forming a contact opening. Furthermore, the method may also scale down the critical size of the semiconductor device structure, and may also effectively decrease the on resistance of the semiconductor device structure.

While the disclosure has been described by way of example and in terms of the preferred embodiments, it is to be understood that the disclosure is not limited to the disclosed embodiments. Those skilled in the art may make various changes, substitutions, and alterations herein without departing from the spirit and scope of the present disclosure. The appended claims are intended to cover all such modifications which may fall within the spirit and scope of the disclosure.

What is claimed is:

1. A method for forming a semiconductor device structure, comprising:
    forming a plurality of trenches in a substrate;
    forming a gate dielectric layer lining the plurality of trenches;
    filling the plurality of trenches with a gate material;
    etching back the gate material to expose an upper portion of the plurality of trenches;
    forming a first dielectric layer to refill the upper portion of the plurality of trenches and to cover a substrate surface between the plurality of trenches;
    performing a first chemical mechanical planarization process to partially remove the first dielectric layer until the substrate surface between the plurality of trenches is exposed; and
    using the first dielectric layer in the upper portion of the plurality of trenches as an etching mask, etching the substrate through the exposed substrate surface to form a self-aligned contact opening between the plurality of trenches.

2. The method for forming a semiconductor device structure as claimed in claim 1, further comprising:
    before the step of forming the gate dielectric layer, performing an etching process to round a top corner of the plurality of trenches.

3. The method for forming a semiconductor device structure as claimed in claim 1, wherein the step of forming the plurality of trenches comprises:
    forming a hard mask layer on the substrate; and
    performing an etching process so that the plurality of trenches each have a tapered profile.

4. The method for forming a semiconductor device structure as claimed in claim 1, wherein the first dielectric layer is formed by using a high density plasma chemical vapor deposition process.

5. The method for forming a semiconductor device structure as claimed in claim 1, wherein after the step of etching back the gate material further comprises:
using a high density plasma chemical vapor deposition process forming a second dielectric layer in the upper portion of the plurality of trenches and the substrate surface between the plurality of trenches;
partially removing the second dielectric layer to expose the top corner of the plurality of trenches; and
using the remaining second dielectric layer as an etching mask, isotropically etching the plurality of trenches to expand the upper portion of the plurality of trenches.

6. The method for forming a semiconductor device structure as claimed in claim 5, further comprising:
performing a second chemical mechanical planarization process to partially remove the remaining second dielectric layer until the substrate surface between the plurality of trenches is exposed.

7. The method for forming a semiconductor device structure as claimed in claim 1, further comprising:
after the step of etching back the gate material or the step of performing the first chemical mechanical planarization process, forming a body region and a source region above the body region in the substrate between the plurality of trenches.

8. A method for forming a semiconductor device structure, comprising:
providing a substrate, wherein a pad layer is formed on the substrate;
forming a plurality of trenches in the substrate;
isotropically etching a top corner of the plurality of trenches to expand the upper portion of the plurality of trenches;
forming a gate dielectric layer lining the plurality of trenches;
filling the plurality of trenches with a gate material;
etching back the gate material to expose the expanded upper portion of the plurality of trenches;
forming a dielectric layer to refill the expanded upper portion of the plurality of trenches and to cover a substrate surface between the plurality of trenches;
performing a chemical mechanical planarization process to partially remove the dielectric layer until the substrate surface between the plurality of trenches is exposed; and
using the dielectric layer in the expanded upper portion of the plurality of trenches as an etching mask, etching the substrate through the exposed substrate surface to form a self-aligned contact opening between the plurality of trenches.

9. The method for forming a semiconductor device structure as claimed in claim 8, wherein the step of isotropically etching the top corner of the plurality of trenches comprises:
before the step of isotropically etching, performing a pull-back etching process to partially remove the pad layer adjacent to the plurality of trenches so that the top corner of the plurality of trenches is exposed.

10. The method for forming a semiconductor device structure as claimed in claim 9, wherein the pad layer comprises an oxide layer and a nitride layer formed on the oxide layer, wherein the pull-back etching process partially removes the oxide layer adjacent to the plurality of trenches.

11. The method for forming a semiconductor device structure as claimed in claim 8, wherein the dielectric layer is formed by using a high density plasma chemical vapor deposition process.

12. The method for forming a semiconductor device structure as claimed in claim 8, further comprising:
after the step of etching back the gate material or the step of performing the chemical mechanical planarization process, forming a body region and a source region above the body region in the substrate between the plurality of trenches.

* * * * *